(12) United States Patent
Damaraju et al.

(10) Patent No.: US 8,345,491 B2
(45) Date of Patent: *Jan. 1, 2013

(54) MEMORY CELL WRITE

(75) Inventors: Satish K. Damaraju, El Dorado Hills, CA (US); Ak R. Ahmed, Rancho Cordova, CA (US); Scott E. Siers, Elk Grove, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/282,331

(22) Filed: Oct. 26, 2011

(65) Prior Publication Data

US 2012/0039135 A1 Feb. 16, 2012

Related U.S. Application Data

(63) Continuation of application No. 12/564,765, filed on Sep. 22, 2009, now Pat. No. 8,050,116.

(51) Int. Cl.
*G11C 7/00* (2006.01)

(52) U.S. Cl. ............................... 365/189.16; 365/230.05

(58) Field of Classification Search ............. 365/189.16, 365/230.05

See application file for complete search history.

(56) References Cited

U.S. PATENT DOCUMENTS 5,930,181 A * 7/1999 Koshita .................. 365/190

* cited by examiner

*Primary Examiner* — Son Dinh
*Assistant Examiner* — Nam Nguyen
(74) *Attorney, Agent, or Firm* — Schwabe, Williamson & Wyatt, P.C.

(57) ABSTRACT

Embodiments of a memory cell comprising a voltage module configured to supply a first supply voltage and a second supply voltage, a data node programming module configured to receive the first supply voltage and to program a data node based at least in part on a write data line, and a complementary data node programming module configured to receive the second supply voltage and to program a complementary data node based at least in part on a complementary write data line, wherein the voltage module is configured such that the first supply voltage is substantially different from the second supply voltage for a period of time while the memory device is being programmed. Additional variants and embodiments may also be disclosed and claimed.

20 Claims, 5 Drawing Sheets

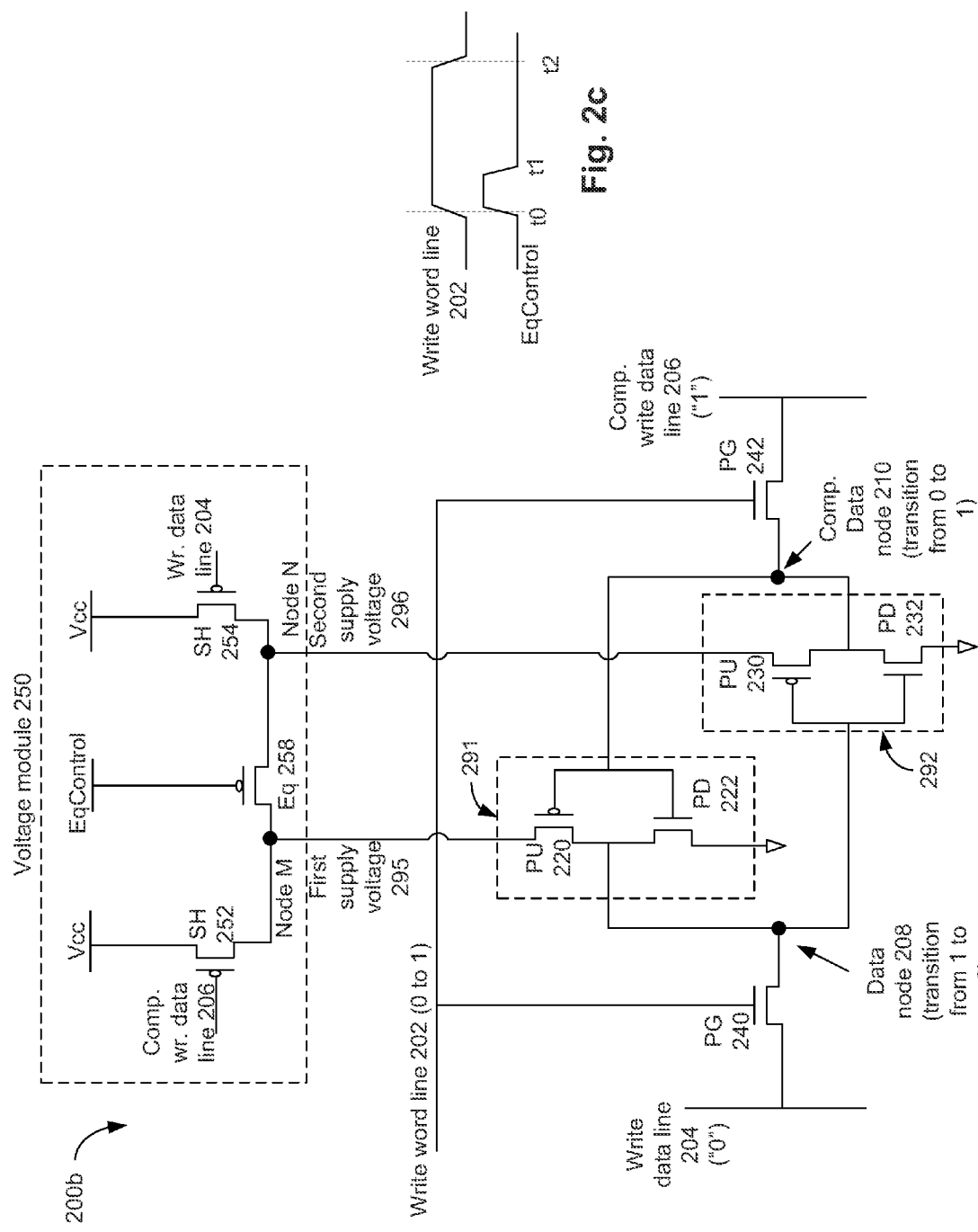

MEMORY CELL WRITE

CROSS REFERENCE TO RELATED APPLICATION

The present application is a continuation of and claims priority under 35 U.S.C. §120 to U.S. patent application Ser. No. 12/564,765, entitled "MEMORY CELL WRITE," filed Sep. 22, 2009, assigned to the same assignee as the present application, and incorporated herein by reference in its entirety.

TECHNICAL FIELD

Embodiments of the disclosure relate generally to fields of electronic systems, and more particularly, to memory cells.

BACKGROUND

For some applications, it may be desirable to achieve a relatively low minimum operating voltage (e.g., low active VccMin), in order to, for example, save power. In some of these applications, caches (e.g., small-signal arrays), memories and/or register files may limit the active VccMin of a circuit. Accordingly, it may be desirable to improve the active VccMin (e.g., by lowering the active VccMin) in caches, memories and/or register files.

BRIEF DESCRIPTION OF THE DRAWINGS

Various embodiments will be described referencing the accompanying drawings in which like references denote similar elements, and in which:

FIGS. 2a and 2b schematically illustrate an exemplary memory cell, in accordance with various embodiments of the present invention;

FIG. 2c illustrates exemplary timing diagram for variations in an equalizing control signal of FIG. 2b;

DETAILED DESCRIPTION OF ILLUSTRATIVE EMBODIMENTS

Illustrative embodiments include, but are not limited to, methods and apparatus for writing in a memory cell.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the disclosure. This application is intended to cover any adaptations or variations of the embodiments discussed herein. Therefore, it is manifestly intended that the embodiments of the disclosure be limited only by the claims and the equivalents thereof.

Figure 1:
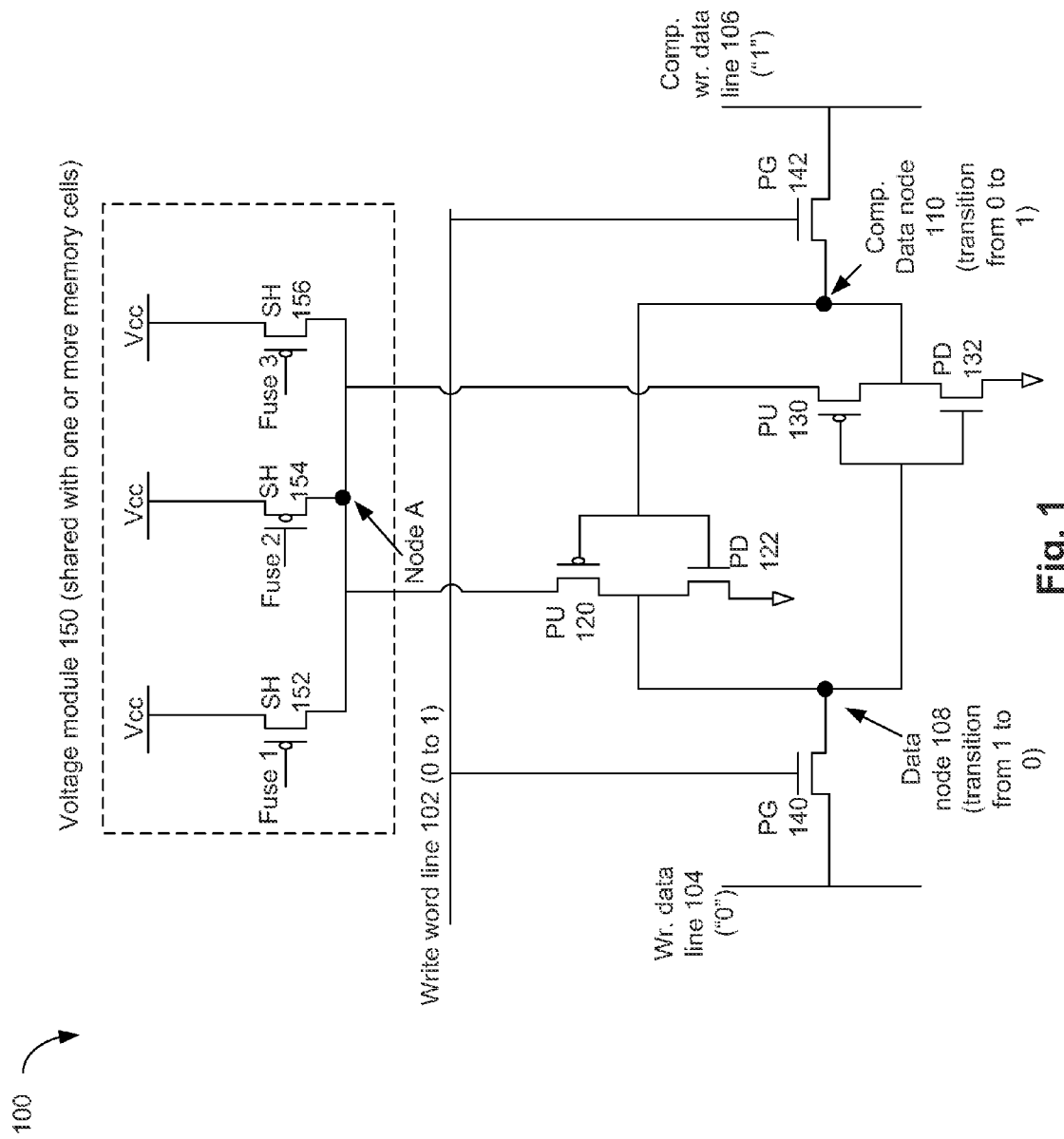
FIG. 1 schematically illustrates a conventional memory cell, which may be used to store a single bit of data.

FIG. 1 schematically illustrates a conventional memory cell 100, which may be used to store a single bit of data. The memory cell 100 may be operatively coupled to a write word line 102 that may transition from a low voltage (e.g., a voltage level that represents logic 0, a relatively low voltage, a voltage that is at or near a ground voltage, and/or the like) to a high voltage (e.g., a voltage level that represents logic 1, a relatively high voltage, a voltage that is at or near a supply voltage Vcc, and/or the like) whenever data is written to the memory cell 100. That is, the write word line 102 may transition from 0 to 1 whenever the memory cell 100 is programmed.

The memory cell 100 may also be operatively coupled to a write data line 104 and a complementary write data line 106. The write data line 104 may be set to 0 when data bit 0 is written to the memory cell 100, and may be set to 1 when data bit 1 is written to the memory cell 100. The complementary write data line 106 may, in contrast, be set to 1 when data bit 0 is written, and may be set to 0 when data bit 1 is written to the memory cell 100.

The memory cell 100 may include a data node 108 and a complementary data node 110 operatively coupled to pass gate (PG) transistors PG 140 and PG 142, respectively, as illustrated in FIG. 1. The memory cell 100 may also include a voltage module 150 (illustrated by dotted line), that may be shared with one or more other memory cells and configured to generate a supply voltage for one or more components of the memory cell 100. The voltage module 150 may include shared transistors SH 152, SH 154 and SH 156. The transistors SH 152, SH154 and SH 156 may be controlled by respective fuses fuse 1, fuse 2 and fuse 3. The fuses 1, 2 and 3 may control transistors SH 152, SH154 and SH 156 such that a node A is pulled at or near the supply voltage Vcc (because of voltage drop at the shared transistors SH152, . . . , 156, the voltage at node A may be slightly less than Vcc). The memory cell 100 may also include pull up (PU) transistors PU 120 and 130, and pull down (PD) transistors 122 and 132, as illustrated in FIG. 1.

In the memory cell 100, a single data bit may be stored in the data node 108. Also, when bit 0 is stored in the data node 108, bit 1 may be stored in the complementary data node 106, and vice versa. An appropriate read circuit (not illustrated in FIG. 1) may read the data stored in the data node 108 and/or the complementary data node 110.

A write operation or programming of the memory cell 100 is now explained by assuming that the memory cell 100 had a bit 1 stored in the data node 108 (i.e., a bit 0 stored in the complementary data node 110), and is currently being programmed to store bit 1 (illustrated by "transition from 1 to 0" in the data node 108 in FIG. 1). While being programmed, the write word line 102 may transition from low (e.g., 0) to high (e.g., 1) state, which may turn ON the pass gate transistors PG 140 and PG 142. Also, the write data line 104 may be 0 and the complementary write data line 106 may be 1, based on data bit 0 being programmed in the memory cell 100.

Before the beginning of the write operation, the data node 108 was maintained at high voltage (i.e., storing bit 1), and the complementary data node 110 was maintained at low voltage (i.e., storing bit 0). Thus, before the beginning of the write operation, the PU 120 was ON (as the complementary data node 110 was at 0), thus maintaining the data node 108 at a high voltage by operatively coupling the data node 108 with the supply voltage Vcc through PU 120 and one or more of the shared transistors SH 152, . . . , 156. Similarly, before the beginning of the write operation, the PD 132 was ON, thus maintaining the complementary data node 110 at a low voltage by operatively coupling the complementary data node 110 to the ground potential through PD 132.

Upon commencement of the write operation, the PG 140 may be turned ON by the write word line 102, which may try to pull down the data node 108 to the low voltage of the write data line 104. On the other hand, as the complementary data node 110 was at a low voltage before commencement of the write operation, the low voltage of the complementary data node 110 may continue to keep ON the pull up transistor PU 120, which may prevent the data node 108 to enter in the low voltage state (as the PU 120 may continue supplying high voltage from node A to the data node 108). Also, as long as the data node 108 is at the high voltage state, this may prevent turning ON of PU 130 and continue to keep the PD 132 at ON, which may try to maintain the complementary data node 110 at low voltage.

Put differently, although the PG 140 may try to pull down the voltage of the data node 108 to a low voltage as part of the write operation, the transistor PU 120 (which was ON before commencement of the write operation, and tries to remain ON as the complementary data node 110 has not fully turned to high) may try prevent the data node 108 to transition to the low voltage. Similarly, although the PG 142 may try to pull up the voltage of the complementary data node 110 to a high voltage as part of the write operation, the PU 130 (which was OFF before commencement of the write operation, and tries to remain OFF as the data node 108 has not fully turned to low voltage) and the PD 132 (which was ON before commencement of the write operation, and tries to remain ON as the data node 108 has not fully turned to low voltage) may try prevent such operation.

Thus, while programming a bit 0 to the memory cell 100 that initially included a bit 1, there may be a conflict between operations of transistors PG 140 and PU 120, and the write operation may not be completed successfully unless the PG 140 overpowers the PU 120 and brings the data node 108 to a low voltage. This conflict is usually termed as "contention," as transistors PG 140 and PU 120 may be "contending" with each other. Similarly, there may be a conflict between operations of transistors PG 142, PU 130 and PD 132, and the write operation may not be completed successfully unless the complementary data node 108 is pulled up to the high voltage. This conflict is usually termed as "completion." Thus, contention and completion may pose problems in successfully completing a write operation in the memory cell 100.

Figure 2A:
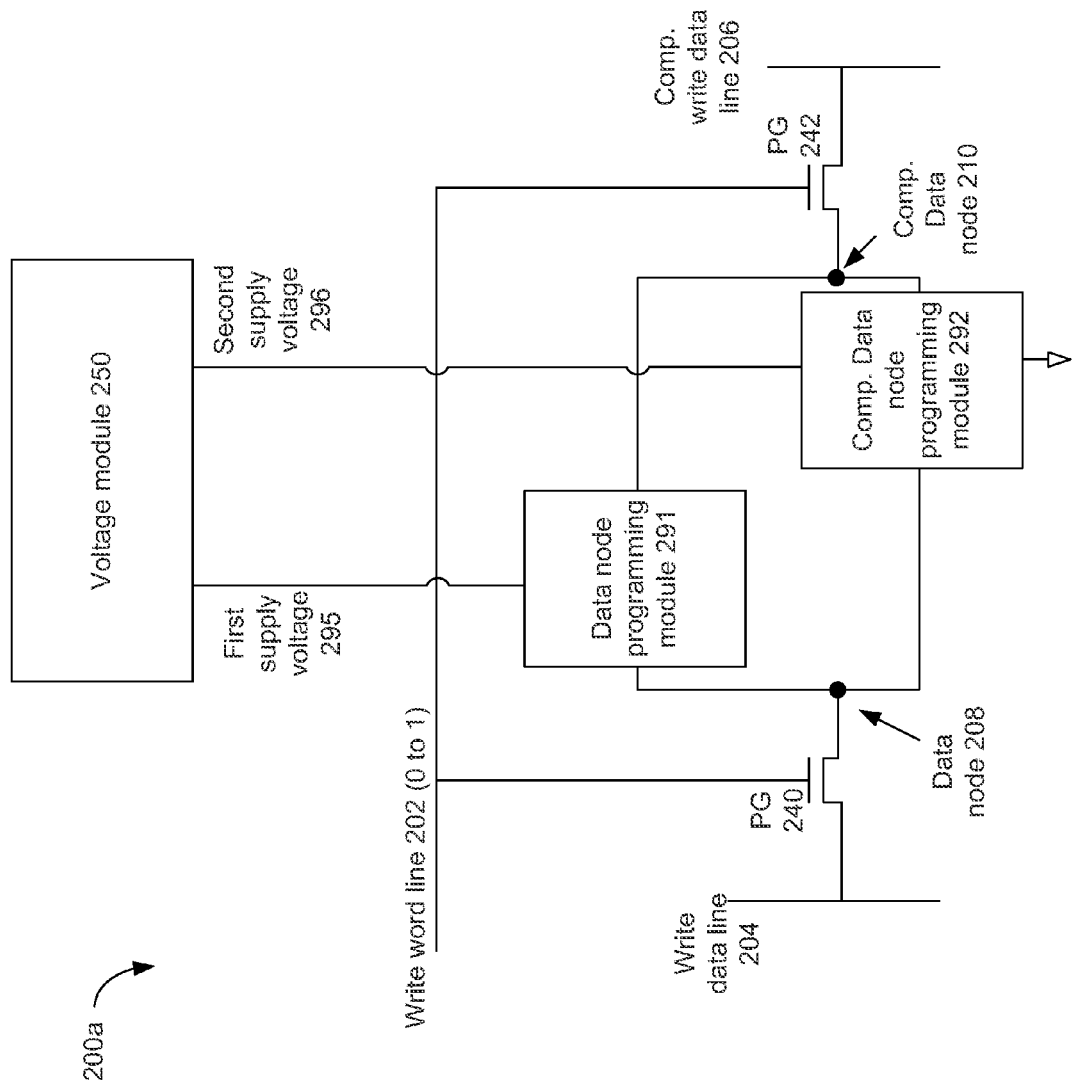

FIG. 2a schematically illustrates an exemplary memory cell 200a, in accordance with various embodiments of the present invention. In various embodiments, the memory cell 200a may store a single bit of data, and may be used, for example, in a register file or a main memory of a computing device. In various embodiments, the memory cell 200a may include a data node programming module 291 configured to program a data node 208 to bit 0 or bit 1, based at least in part on a write data line 204. The memory cell 200a may also include a complementary data node programming module 292 configured to program a complementary data node 210 to a bit (e.g., 0 or 1) that is opposite to the bit programmed in the data node 208, based at least in part on a complementary write data line 208. For example, if bit 0 is programmed in the data node 208, bit 1 may be programmed in the complementary data node 210, and vice versa.

In various embodiments, the data node programming module 291 may be operatively coupled to the write data line 204 through a pass gate transistor 240, and the complementary data node programming module 292 may be operatively coupled to the complementary write data line 208 through a pass gate transistor 242. A write word line 202 may be configured to control the pass gate transistors 240 and 242. A more detailed structure and operation of the data node programming module 291 and the complementary data node programming module 292 will be discussed in more detail herein later.

The memory cell 200a may also include a voltage module 250 configured to provide a first supply voltage 295 to the data node programming module 291, and to provide a second supply voltage 296 to the complementary data node programming module 292. In various embodiments, the first and second supply voltages may be different for at least a period of time the memory cell 200a is being programmed. For example, the voltage module 250 may be configured such that the first supply voltage is relatively lower than the second supply voltage for a period of time while a bit 0 is being programmed in the data node 208, and may be further configured such that the second supply voltage is relatively lower than the first supply voltage for a period of time while a bit 1 is being programmed in the data node 208, as will be explained in more detail herein later.

In various embodiments, the voltage module 250 may be external to the memory cell 200a. That is, the voltage module 250 (or at least a part of the voltage module 250) may not be a part of the memory cell 200a. In some of these embodiments, the voltage module 250 may be shared with the memory cell 200a, and one or more other memory cells (not illustrated in the FIG. 2a).

FIG. 2b schematically illustrates an exemplary memory cell 200b, in accordance with various embodiments of the present invention. In various embodiments, the memory cell 200b illustrates the memory cell 200a of FIG. 2a in more detail. In various embodiments, the memory cell 200b may include a plurality of P-channel and N-channel metal oxide semiconductor field effect (MOSFET) transistors, although any other appropriate type(s) of transistors (e.g., bipolar junction transistor (BJT), junction gate field effect transistor (JFET), and/or the like) may also be used, as will be appreciated by those skilled in the art based on the teachings provided in this disclosure.

In various embodiments, the memory cell 200b may be operatively coupled to the write word line 202 that transitions from a low voltage (i.e., bit 0) to a high voltage (i.e., bit 1) whenever data is to be written to the memory cell 200b. In various embodiments, the memory cell 200b may also be operatively coupled to the write data line 204 and the complementary write data line 206. Similar to the memory cell 100, the write data line 204 of memory cell 200b may be set to 0 when data bit 0 is written to the memory cell 200b, and may be set to 1 when data bit 1 is written to the memory cell 200b. The complementary write data line 206 may, on the other hand, be set to 1 when data bit 0 is written to the memory cell 200b, and may be set to 0 when data bit 1 is written to the memory cell 200b.

In various embodiments, the memory cell 200b may include the data node 208 and the complementary data node 210, which may be operatively coupled to the write data line 204 and the complementary write data line 206 through pass gate transistors PG 240 and PG 242, respectively. In various embodiments, the pass gate transistors PG 140 and PG 142 may be N-channel MOSFETs, and may be controlled by the write word line 202.

The memory cell 200b may also include the voltage module 250 (illustrated by dotted line), that may be shared with one or more memory cells. For example, in one embodiment, the voltage module 250 may be shared with 7 other memory cells. In various embodiments, the voltage module 250 may be external to the memory cell 200b.

In various embodiments, the voltage module 250 may include a number of shared transistors (e.g., P-channel MOSFETs), e.g., shared transistors SH 252 and SH 254. In various embodiments, the shared transistor SH 252 may be operatively coupled between the supply voltage Vcc and a node M, and the shared transistor SH 254 may be operatively coupled between the supply voltage Vcc and a node N. In various embodiments, the SH 252 may be controlled by the complementary write data line 206, whereas the SH 254 may be controlled by the write data line 204.

Although FIG. 2b illustrates only one shared transistor SH 252 operatively coupled between Vcc and node M, there may be more than one shared transistor operatively coupled, in parallel, between Vcc and node M. Similarly, although FIG. 2b illustrates only one shared transistor SH 254 operatively coupled between Vcc and node N, there may be more than one shared transistor operatively coupled, in parallel, between Vcc and node N. Coupling more number of shared transistors between Vcc and nodes M and/or N may increase a driving capability (e.g., the number of memory cells driven by the voltage module 250) of the voltage module 250.

The voltage module 250 may also include an equalizing transistor Eq 258, which may be, for example, a P-channel MOSFET. In various embodiments, the Eq 258 may be operatively coupled between nodes M and N, and may be controlled by an equalizing control signal EqControl.

In various embodiments, the data node programming module 291 (illustrated by dotted line) may include a pull up transistor PU 220 and a pull down transistor 222, and the complementary data node programming module 292 (also illustrated by dotted line) may include a pull up transistor 230 and a pull down transistor PD 232. In various embodiments, the pull up transistors 220 and 230 may be P-channel MOSFETs, while the pull down transistors 222 and 232 may be N-channel MOSFETs, although other appropriate type(s) of transistors may also be used. In various embodiments, PU 220 may be operatively coupled between node M (configured to receive the first supply voltage 295) of the voltage module 250 and the data node 208, and PD 222 transistor may be operatively coupled between the data node 208 and ground. In various embodiments, PU 220 and PD 222 may be controlled by the complementary data node 210. Also, PU 230 may be operatively coupled between node N (configured to receive the second supply voltage 296) of the voltage module 250 and the complementary data node 210, and PD 232 may be operatively coupled between the complementary data node 210 and ground. In various embodiments, PU 230 and PD 232 may be controlled by the data node 208.

Similar to the memory cell 100 of FIG. 1, in the memory cell 200b of FIG. 2b, a single data bit (bit 0 or bit 1) may be stored in the data node 208. Also, when bit 0 is stored in the data node 208, bit 1 may be stored in the complementary data node 206, and vice versa. In various embodiments, an appropriate read circuit (not illustrated in FIG. 2b) may read the data bit stored in the data node 208 and/or the complementary data node 210.

The operation of the memory cell 200b is now explained by assuming that the memory cell 200b had a bit 1 stored in the data node 208, and is currently being programmed to store bit 0 (illustrated by "transition from 1 to 0" in the data node 208 in FIG. 2b). Thus, it is also assumed that the memory cell 200b had a bit 0 stored in the complementary data node 210, and is currently being programmed to store bit 1 (illustrated by "transition from 0 to 1" in the complementary data node 210 in FIG. 2b).

As previously discussed with respect to FIG. 1, while the memory cell 200b is being programmed, the write word line 202 may transition from low (e.g., 0) to high (e.g., 1) state, which may turn ON the N-channel pass gate transistors PG 240 and PG 242.

Also, while the memory cell 200b is being programmed, the write data line 204 may be 0, and the complementary write data line 206 may be 1 (as data bit 0 is being written to the memory cell 200b). Accordingly, the P-channel MOSFET SH 252 (which may be controlled by the complementary write data line 206) may be OFF, and the P-channel MOSFET SH 254 (which may be controlled by the write data line 204) may be ON. Also, in various embodiments, the EqControl signal may be configured such that the equalizing transistor Eq 258 is turned ON for at least a period of time the memory cell 200b is being programmed. Thus, node M may receive the supply voltage Vcc through stacked transistors SH 254 and Eq 258 (as transistor SG 252 if OFF), whereas node N may receive the supply voltage Vcc through transistor SH 254. Put differently, node M may receive the supply voltage Vcc through two stacked transistors, whereas node N may receive the supply voltage Vcc through a single transistor.

Also, there may a voltage drop in SH 254, resulting in a voltage $V_N$ at node N being slightly less than the supply voltage Vcc. Furthermore, because of the voltage drop at the Eq 258, in various embodiments, the voltage at node M (e.g., $V_M$) may be even lower than the voltage $V_N$ at node N. Thus, for at least a period of time while the memory cell 200b is being programmed to store a bit 0, the voltage $V_M$ may be less than voltage $V_N$, where the difference between the two voltages may be due to the voltage drop across the equalizing transistor Eq 258.

Also, while the memory cell 200b is being programmed to store bit 0, PG 240 may be ON and may try to pull down the data node 208 to the potential of the write data line 204 (which is at a low voltage), while the pull up transistor PU 220 (which may still be ON, as the complementary data node 210 may still be at a low voltage) may try to pull up the data node 208 to the potential of the node M. However, as the voltage $V_M$ at node M is now relatively low (e.g., as compared to voltage $V_N$ at node N and the supply voltage Vcc), it may be relatively easier for the transistor PG 240 to overpower the transistor PU 220, and pull down the data node 208 to low voltage (e.g., such that the data node 208 stores bit 0).

On the other hand, while the memory cell 200b is being programmed, PG 242 may be ON and may try to pull up the complementary data node 210 to the potential of the complementary write data line 206 (which is at a high voltage), while the pull down transistor PD 232 (which may still be ON, as the data node 208 may still be at a low voltage initially) may try to pull down the complementary data node 210 to the ground potential. Also, PU 230 may try to turn ON and pull up the complementary data node 210 at the voltage $V_N$ at node N. As the voltage $V_N$ at node N is now relatively high (e.g., as compared to voltage $V_M$ at node M), it may be relatively easier to pull up the complementary data node 210 at high voltage (e.g., such that the data node 210 stores bit 1).

Thus, lowering the voltage $V_M$ at node M (e.g., as compared to voltage $V_N$ at node N) by introducing the equalizing transistor Eq 258 may facilitate the PG 240 to overpower the PU 220 relatively easily, thereby facilitating the memory cell 200b to resolve contention between PG 240 and PU 220, and facilitating the memory cell 200b to pull down the data node 208 at low voltage (such that the memory cell 200b stores bit 0). This may not be the case for the conventional memory cell 100 of FIG. 1, where both the pull up transistors PU 120 and PU 130 are coupled to the same node (node A). In various embodiments, this may also help reduce or lower the active Vcc of the memory cell 200b, without adversely affecting the write or programming operation of the memory cell 200b.

Also, on the other hand, while a bit 1 is to be programmed in the memory cell 200b (i.e., a situation opposite to the situation discussed so far), in various embodiments, the transistors SH 252 and Eq 258 may be ON and SH 254 may be OFF for at least a period of time bit 1 is being programmed in the memory cell 200b. In this case, voltage $V_N$ at node N may be relatively lower than the voltage $V_M$ at node M (because of the additional drop in Eq 258, while the supply voltage reaches node N through SH 252 and Eq 258). This may help the transistor PG 242 to overpower the PU 230, and pull down the voltage of the complementary data node 210 at the low voltage, thereby facilitating the completion of the write operation. Also, the relatively high voltage $V_M$ at node M (e.g., as compared to voltage $V_N$) may help in pulling up the data node 208 to the high voltage.

In various embodiments, the equalizing transistor Eq 258 may be ON whenever the memory cell 200b is being programmed (e.g., by making the equalizing control signal always low), which may ensure that the voltages of nodes M and N are unequal (based on whether a 0 or a 1 is being programmed in the memory cell 200b). In various other embodiments, the equalizing transistor Eq 258 may be controlled to be turned ON only for a portion of time the memory cell 200b is being programmed, which may ensure greater variation in voltages of nodes M and N.

For example, FIG. 2c illustrates exemplary timing diagram for variations in the equalizing control signal EqControl of FIG. 2b. In FIG. 2c, the memory cell 200b may be programmed between time t0 and t2, during which the write word line 202 may be high. As illustrated in FIG. 2c, in various embodiments, EqControl may be high (i.e., the Eq 258, which is a P-channel MOSFET, may be OFF) for time t0 to t1, and EqControl may be low (i.e., the Eq 258 may be ON) for time t1 to t2.

Thus, the memory cell may be programmed during a first period of time (e.g., from time t0 and t2) that consists of a second period (e.g., from time t0 to t1) and third period (e.g., from time t1 to t2), where Eq 258 may be OFF for the second period of time, and may be ON for the third period of time.

When a bit 0 is to be programmed in the memory cell 200b, it may be desirable to bring the data node 208 to low voltage, as previously discussed. Also, during such programming, the SH 252 transistor may be turned OFF (e.g., by the high complementary write data line 206), as previously discussed. Also, turning OFF the Eq 258 for the second period of time (e.g., between t0 to t1) may result in node M not receiving the supply voltage Vcc (neither through the turned OFF SH 252, nor through the SH 254 and Eq 258) for this time period. This may ensure that the data node 208 is pulled down to low voltage relatively easily (as PU 220 is not be receiving a high voltage from node M, the PU 220 may not try to pull up the data node 208). Also, turning OFF Eq 258 for the second period may not affect the voltage in node N, and hence, may not affect pulling up the complementary data node 210 to a high voltage. Once the data node 208 is pulled down to low voltage and the complementary data node 210 is pulled up to high voltage, the Eq 258 may be turned ON at time t1. Turning ON the Eq 258 transistor at or near the end of the programming of the memory cell 200b may be required to at least partially equalize the voltages of the nodes M and N, which may be required for subsequent programming operations and/or other operations of the memory cell 200b.

In various embodiments, the duration of the second and third period of time may be programmable based at least in part on, for example, the time the memory cell 200b may take to be properly and fully programmed, and/or on individual characteristics of the pass gate, pull up, and/or pull down transistors of the memory cell 200b.

Figure 2D:
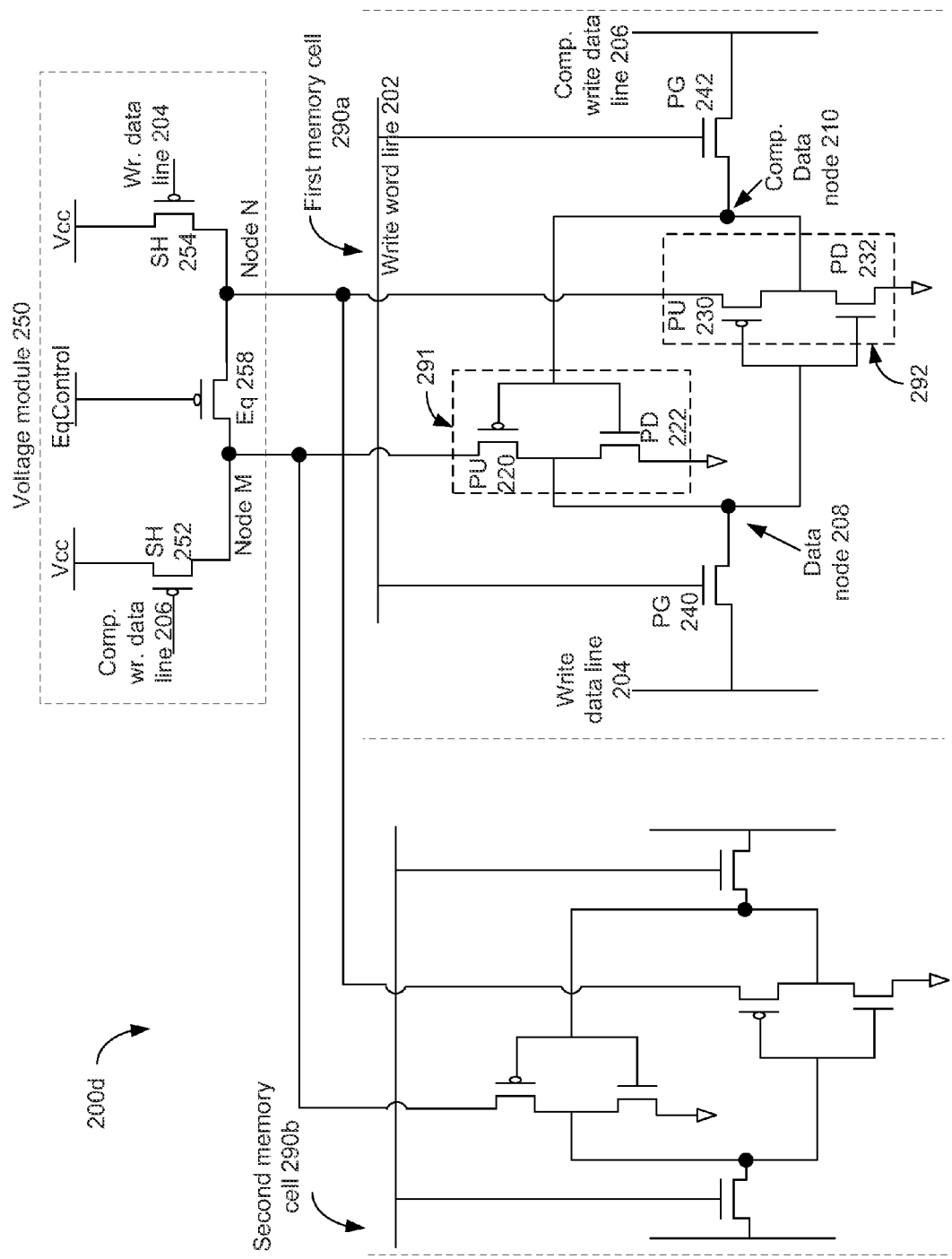
FIG. 2d schematically illustrates an exemplary register file that includes a plurality of memory cells, in accordance with various embodiments of the present invention.

FIG. 2d schematically illustrates an exemplary register file 200d that includes a plurality of memory cells, in accordance with various embodiments of the present invention. In various embodiments, the plurality of memory cells may include at least a first memory cell 290a and a second memory cell 290b, each of which may store a single bit of data. Each of the memory cells 290a and 290b may be at least in part similar to the memory cell 200b illustrated in FIG. 2b. Also, although only the components of the memory cell 290a are labeled in FIG. 2d, the memory cell 290b may also include similar components.

In various embodiments, the voltage module 250 of register file 200d may be shared by at least the memory cells 290a and 290b (and possibly by, for example, 6 other memory cells). Thus, the two pull up transistors of memory cells 290a and 290b may be operatively coupled to the nodes M and N, as illustrated in FIG. 2d. Individual memory cells and the voltage module of FIG. 2d may operate similar to the memory cell 200b of FIG. 2b, and hence, operation of the memory cells of the register file 200d will not be explained in further detail herein.

Figure 3:
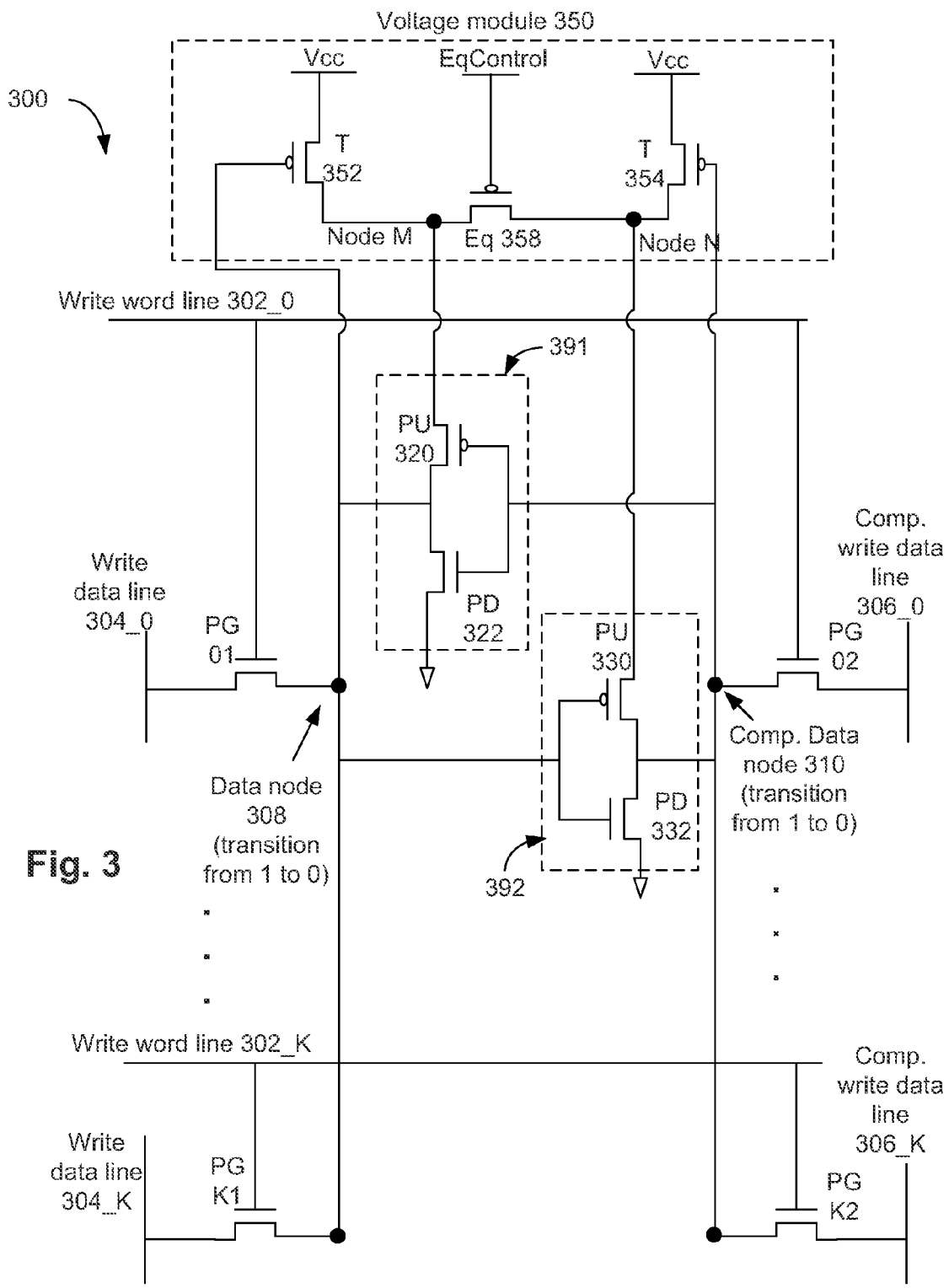
FIG. 3 schematically illustrates another exemplary memory cell, in accordance with various embodiments of the present invention.

FIG. 3 schematically illustrates an exemplary memory cell 300, in accordance with various embodiments of the present invention. Some of the components of the memory cell 300 may be at least in part similar to corresponding components of the memory cell 200b of FIG. 2b.

Similar to memory cell 200b, in various embodiments, the memory cell 300 may be configured to store a single bit of data in data node 308. The memory cell 300 may include a data node programming module 391 comprising pull up transistor PU 320 and pull down transistor 322. The memory cell 300 may also include a complementary data node programming module 392 comprising pull up transistor PU 330 and pull down transistor 332.

The memory cell 300 may also include a transistor block 350 that may include transistors T 352 and T 354, and equalizing transistor Eq 358. Unlike the voltage module 250 of FIG. 2b, in various embodiments, the transistor block 350 may not be shared with any other memory cell. Also, in various embodiments, the transistors T 352 and T 354 may be controlled by the data node 308 and complementary data node 310, respectively.

In various embodiments, the memory cell 300 may include a plurality (e.g., K+1 number) of write data lines 304_0, ..., 304_K, corresponding plurality of complementary write data lines 306_0, ..., 306_K, and corresponding plurality of write word lines 302_0, ..., 302_K. Each write data line and complementary write data line may be operatively coupled to the data node 308 and complementary data node 310 through respective pass gate transistors. For example, write data line 304_K and complementary write data line 306_K may be operatively coupled to the data node 308 and complementary data node 310 through respective pass gate transistors PG K1 and PG K2. Each pass gate transistor (e.g., PG K1 and PG K2) may be controlled by respective write word line (e.g., write word line 302_K).

The memory cell 300 may be a multi-port memory cell configured to store a single bit of data in the data node 308 and/or complementary data node 310. At any time, the memory cell 300 may be programmed using any of the (K+1) write data line, the corresponding complementary write data line and the corresponding write word line. For example, during a first time period, the memory cell 300 may be programmed using the write data line 304_0, complementary write data line 306_0, and write word line 302_0, and/or may also be programmed, during a second time period, using the write data line 304_K, complementary write data line 306_K, and write word line 302_K.

Similar to Eq 258 of FIG. 2b, the equalizing transistor Eq 358 in the memory cell 300 may be controlled to create a voltage difference in nodes M and N, which may facilitate the programming the memory cell 300 more effectively, as will be readily understood by those skilled in the art based at least in part on the teachings provided herein.

Although certain example methods, apparatus, and articles of manufacture have been described herein, the scope of coverage of this disclosure is not limited thereto. On the contrary, this disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A memory device comprising:
    a first programming module configured to receive a first supply voltage and to program a data node based at least in part on a write data line; and
    a second programming module configured to receive a second supply voltage and to program a complementary data node based at least in part on a complementary write data line;
    wherein the first supply voltage is different from the second supply voltage for a period of time while the memory device is being programmed.

2. The memory device of claim 1, wherein the first supply voltage is relatively higher than the second supply voltage at least for a period of time while a bit 1 is being programmed in the memory device.

3. The memory device of claim 1, wherein the first supply voltage is relatively lower than the second supply voltage for a period of time while a bit 0 is being programmed in the memory device.

4. The memory device of claim 1,
    wherein the first programming module comprises a first pull up transistor operatively coupled between the data node and a first supply node configured to receive the first supply voltage, the first pull up transistor being controlled by the complementary data node; and
    wherein the second programming module comprises a second pull up transistor operatively coupled between the complementary data node and a second supply node configured to receive the second supply voltage, the second pull up transistor being controlled by the data node.

5. The memory device of claim 4, further comprising:
    a first pass gate transistor operatively coupled between the write data line and the data node, the first pass gate transistor being controlled by a write word line; and
    a second pass gate transistor operatively coupled between the complementary write data line and the complementary data node, the second pass gate transistor being controlled by the write word line.

6. The memory device of claim 4, wherein the second pull up transistor receives the second supply voltage from a supply voltage source through N number of stacked transistors for at least the period of time, and wherein the first pull up transistor receives the first supply voltage from the supply voltage source through (N+1) number of stacked transistors for at least the period of time, wherein N is a non-zero integer.

7. The memory device of claim 4, further comprising a voltage module configured to supply the first and second supply voltages, wherein the voltage module comprises:
    an equalizing transistor operatively coupled between the first supply node and the second supply node, the equalizing transistor being controlled by an equalizing control signal.

8. The memory device of claim 7, wherein the voltage module further comprises:
    a first shared transistor operatively coupled between a supply voltage source and the first supply node, the first shared transistor being controlled by the complementary write data line; and
    a second shared transistor operatively coupled between the supply voltage source and the second supply node, the second shared transistor being controlled by the write data line.

9. The memory device of claim 8, wherein the memory device is configured such that the first supply node receives the first supply voltage from the supply voltage source through the equalizing transistor and the second shared transistor for at least the period of time, and the second supply node receives the second supply voltage from the supply voltage source through the second shared transistor for at least the period of time.

10. A method for programming a memory cell, the method comprising:
    providing, by a voltage module, a first supply voltage and second supply voltage;
    providing, to a first programming module, the first supply voltage;
    providing, to a second programming module, the second supply voltage, which is different from the first supply voltage for at least a period of time while the memory cell is being programmed;

programming, by the first programming module, a data node using the first supply voltage, based at least in part on a write data line; and programming, by the second programming module, a complementary data node using the second supply voltage, based at least in part on a complementary write data line.

11. The method of claim 10,
wherein said providing the first supply voltage comprises providing the first supply voltage at a first supply node;
wherein said providing the second supply voltage comprises providing the second supply voltage at a second supply node;
wherein the method further comprises:
charging, for at least a period of time while a data bit is being programmed in the memory cell, the second supply node through N number of stacked transistors operatively coupled between the second supply node and a supply voltage source, wherein N is a non-zero integer; and
charging, for at least the period of time while the data bit is being programmed in the memory cell, the first supply node through (N+1) number of stacked transistors operatively coupled between the first supply node and the supply voltage source.

12. The method of claim 11, further comprising:
controlling an equalizing transistor operatively coupled between the first supply node and the second supply node such that the first supply voltage is relatively lower than the second supply voltage at least for the period of time while the data bit is being programmed in the memory cell.

13. A register file, comprising: including
a plurality of memory cells, a first memory cell of the plurality of memory cells including:
a first programming module configured to receive a first supply voltage, and to program a first data node based at least in part on a first write data line; and
a second programming module configured to receive a second supply voltage, and to program a second data node based at least in part on a second write data line;
wherein the first supply voltage is different from the second supply voltage for at least a period of time while the first memory cell is being programmed.

14. The register file of claim 13, wherein the first supply voltage is relatively lower than the second supply voltage at least for a first period of time while a bit 0 is being programmed in the first memory cell, and wherein the first supply voltage is relatively higher than the second supply voltage at least for a second period of time while a bit 1 is being programmed in the first memory cell.

15. The register file of claim 13, further comprising:
a first pass gate transistor operatively coupled between the first write data line and the first data node, the first pass gate transistor being controlled by a write word line;
a second pass gate transistor operatively coupled between the second write data line and the second data node, the second pass gate transistor being controlled by the write word line;
wherein the first programming module comprises a first pull up transistor operatively coupled between the first data node and a first supply node configured to receive the first supply voltage, the first pull up transistor being controlled by the second data node; and
wherein the second programming module comprises a second pull up transistor operatively coupled between the second data node and a second supply node configured to receive the second supply voltage, the second pull up transistor being controlled by the first data node.

16. The register file of claim 13, further comprising a voltage module, wherein the voltage module comprises:
an equalizing transistor operatively coupled between the first supply node and the second supply node;
a first shared transistor operatively coupled between the first supply node and a supply voltage source, the first shared transistor being controlled by the second write data line; and
a second shared transistor operatively coupled between the second supply node and the supply voltage source, the second shared transistor being controlled by the first write data line.

17. A memory cell, comprising:
means for programming a first data node using a first supply voltage, based at least in part on a first write data line; and
means for programming a second data node using a second supply voltage, based at least in part on a second write data line;
wherein the second supply voltage is different from the first supply voltage for at least a period of time while the memory cell is being programmed.

18. The memory cell of claim 17, further comprising:
means for producing the first supply voltage and the second supply voltage and providing the first supply voltage to the means for programming the first data node and providing the second supply voltage to the means for programming the second data node.

19. The memory cell of claim 18, wherein the means for supplying the first supply voltage and the second supply voltage is configured to supply the first supply voltage at a first supply node and the second supply voltage at a second supply node, and the memory cell further comprising:
means for controlling an equalizing transistor operatively coupled between the first supply node and the second supply node such that the first supply voltage is relatively lower than the second supply voltage at least for the period of time while a data bit is being programmed in the memory cell.

20. The memory cell of claim 19, further comprising:
means for charging, for at least a period of time while the data bit is being programmed in the memory cell, the second supply node through N number of stacked transistors operatively coupled between the second supply node and a supply voltage source, wherein N is a non-zero integer; and
means for charging, for at least the period of time while the data bit is being programmed in the memory cell, the first supply node through (N+1) number of stacked transistors operatively coupled between the first supply node and the supply voltage source.

\* \* \* \* \*